United States Patent [19]

Shou et al.

[11] Patent Number: 5,455,581
[45] Date of Patent: Oct. 3, 1995

[54] DIGITAL-TO-ANALOG CONVERTER EMPLOYING A COMMON TRIGGER AND REFERENCE SIGNAL

[75] Inventors: Guoliang Shou; Weikang Yang; Sunao Takatori; Makoto Yamamoto, all of Tokyo, Japan

[73] Assignee: Yozan Inc., Tokyo, Japan

[21] Appl. No.: 154,519

[22] Filed: Nov. 19, 1993

[30] Foreign Application Priority Data

Nov. 20, 1992 [JP] Japan .................................. 4-335535

[51] Int. Cl.⁶ .................................................. H03M 1/82
[52] U.S. Cl. ................................................ 341/152; 341/150
[58] Field of Search ........................................ 341/150, 152

[56] References Cited

U.S. PATENT DOCUMENTS

| | | |
|---|---|---|
| 3,823,396 | 7/1974 | Lode ........................................ 341/145 |
| 4,837,573 | 6/1989 | Brooks ..................................... 341/152 |
| 4,958,159 | 9/1990 | Wyatt ...................................... 341/144 |
| 4,973,978 | 11/1990 | Jordan ..................................... 341/152 |

OTHER PUBLICATIONS

Garrod, "Integrated Circuits", The Electrical Engineering Handbook, pp. 771–783, Richard C. Dorf, Editor-in-Chief, 1991.

*Primary Examiner*—Marc S. Hoff
*Attorney, Agent, or Firm*—Cushman, Darby & Cushman

[57] ABSTRACT

The D/A converter comprises: a digital counter receiving a reference clock pluses and a reference voltage as a start signal so as to output a stop signal when the digital counter counts the reference clock pulses until a predetermined number; and a number is reached, and an RC circuit having a resister and a capacitor receiving the reference voltage so as to be charged by a predetermined time constant until the stop signal is inputted to the RC circuit, whereby the RC circuit is charged up to a voltage corresponding to a time distance between the start signal and the stop signal.

12 Claims, 1 Drawing Sheet

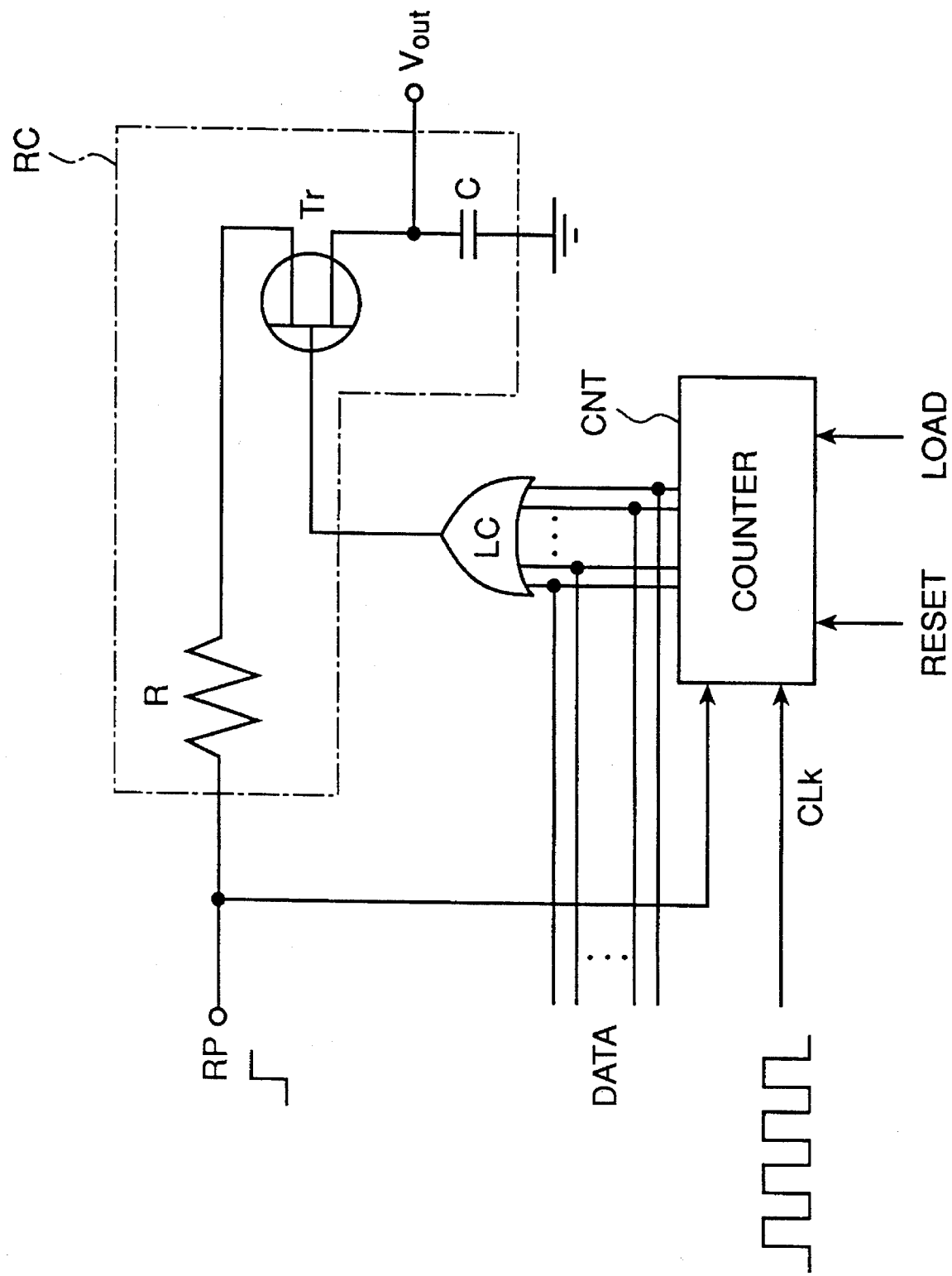

DIGITAL-TO-ANALOG CONVERTER EMPLOYING A COMMON TRIGGER AND REFERENCE SIGNAL

BACKGROUND OF THE INVENTION

1. Field of the Invention

The present invention relates to a digital-to-analog (D/A) converter.

2. Background Information

In recent years, discussion has centered on the limitations of digital computers. In addition, it has become a necessity to process multivalue information. Conventional digital circuits cannot perform calculations using multivalue information. Some inventors have suggested using an exponential function to map a voltage signal to time space and have suggested a way for reflecting an addition and subtraction in time space to a multiplication and division in voltage space. Various kinds of processing concerning time elements, for example, D/A conversions, are necessary when such ideas are realized as a circuit, but a simple method for such D/A conversion does not currently exist.

SUMMARY OF THE INVENTION

The present invention is intended so as to solve the conventional problems and has a purpose to provide an apparatus capable of performing D/A conversion concerning time elements.

A D/A converter according to the present invention consists of a digital counter for counting a reference clock pulse and an RC circuit for converting a time duration into a voltage, the digital counter receives a reference voltage as a start signal and stops charging the RC circuit by outputting a stop signal to the RC circuit.

BRIEF DESCRIPTION OF THE DRAWINGS

FIG. 1 is a circuit diagram showing an embodiment of a D/A converter according to the present invention.

PREFERRED EMBODIMENT OF THE PRESENT INVENTION

Hereinafter an embodiment of a D/A converter according to the present invention is described with reference to the attached drawings.

In FIG. 1, the D/A converter has an RC circuit and a digital counter to which a standard voltage input RP is commonly connected.

The reference voltage input RP is connected to a resistance R in the RC circuit which is connected with a capacitance C. The capacitance C is connected through a field-effect transistor Tr to the resistance R, and is connected to an output terminal $V_{out}$ at one terminal. The other terminal of capacitance C is connected to ground.

Resistance R is connected to a drain of the field-effect transistor Tr. and the output terminal $V_{out}$ and the capacitance C are connected to a source of transistor Tr. An output terminal of a digital counter is connected to a gate of Tr through a logic circuit LC. Tr becomes conductive when a signal from the counter is high level.

Initially, a digital signal to be converted is applied on the DATA lines. When counter CNT receives a LOAD signal, the digital signal is input to counter CNT as a start value for the counter.

When RP changes to Vm, an enable terminal of the digital counter is at a high level. Then, digital counter starts counting the reference clock pulses. That is, RP is input to the counter as a starting signal.

The counter counts down from the start value initially loaded in the counter with every clock pulse so that the total output terminal becomes low level when the number of clock pulses reaches the start value. During the counting, Tr in the RC circuit is conductive. Once counting is finished, Tr becomes nonconductive.

Here, a time of one reference clock pulse is defined as "t", and the predetermined number of clock pulse is defined as "n". The counter outputs a stopping signal to the RC circuit at a time "nt".

That is, time "nt" corresponding to an amount of digital number "n" is estimated as an amount of analog value.

The above reference voltage input is also connected with the RC circuit so that charging of capacitance C of the RC circuit starts simultaneously to the counting of the counter, after RP reaches Vm in a stepwise fashion. Charging is stopped at the point that Tr is cutoff by a stopping signal from a counter. That point is time "nt". At this moment, charging of RC circuit is stopped and a charged voltage of C reaches a value corresponding to "nt".

If the charged voltage of C is defined as $V_{out}$, then $V_{out}$ is defined as following:

$$V_{out} = Vm\{1 - \exp\{-nt/RC\}\}$$

Thus, a digital value "nt" can be kept as an analog voltage value $V_{out}$.

That is, a digital amount is converted into time "nt", and the time is converted into an analog amount "$V_{out}$". Thus, a D/A conversion is executed.

A D/A converter according to the present invention consists of a digital counter for counting a reference clock pulse and a RC circuit for converting a time duration into a voltage, the digital counter receives a reference voltage as a start signal and stops an electrical charge of the RC circuit by outputting a stop signal to the RC circuit, so that it is possible to provide a D/A converter capable of performing D/A conversion with respect to time elements.

The signals provided to the counter via the DATA lines and the signals provided to logic circuit LC from the counter are prevented from interfering with one another, as is known in the art.

What is claimed is:

1. A digital-to-analog converter comprising:
    a digital counter receiving reference clock pulses and a reference voltage, said reference voltage serving as a start signal causing said digital counter to begin counting, said digital counter outputting a digital count signal that acts as a stop signal when said digital counter counts a predetermined number of said reference clock pulses, said predetermined number corresponding to a digital amount to be converted into an analog amount by said digital-to-analog converter; and
    an RC circuit having a resistor and a capacitor, said reference voltage charging said capacitor by a predetermined time constant until said stop signal is provided by said digital counter to said RC circuit, whereby said RC circuit is charged to a voltage corresponding to a time period between said start signal and said stop signal.

2. A digital-to-analog converter as defined in claim 1, further comprising a switching device, responsive to said digital count signal output by said digital counter, for providing said reference voltage to said capacitance in said RC circuit.

3. A digital-to-analog converter as defined in claim 2, wherein said switching device is a transistor, a base of said transistor receiving said digital count signal output by said digital counter, said transistor being turned on, thereby charging said capacitance, and turned off, thereby preventing further charging of said capacitance, by said digital count signal.

4. A digital-to-analog converter as defined in claim 1, further comprising:
   a logic circuit receiving said digital count signal output by said digital counter; and
   a switching device receiving an output of said logic circuit, said switching device charging said RC circuit in response to said output of said logic circuit.

5. A digital-to-analog converter as defined in claim 4, wherein said logic circuit is an OR gate having input terminals connected to output terminals of said digital counter providing said digital count signal, and said switching device is a transistor, wherein a base of said transistor is connected to an output of said OR gate.

6. A digital-to-analog converter as defined in claim 1, further comprising a switching device provided between said resistor and said capacitance such that said digital count signal cause said switching means to turn on, thereby charging said capacitance with said reference voltage, and to turn off, thereby preventing further charging of said capacitance.

7. A digital-to-analog converter comprising:
   digital counting means for outputting a digital count signal over a plurality of lines, said digital counting means receiving a start value, reference clock pulses, and a reference voltage, said reference voltage serving as a start signal causing said digital counter to begin counting down from said start value such that said digital count signal that acts as a stop signal when said digital counting means reaches zero, said start value corresponding to a digital amount to be converted in to an analog amount by said digital-to-analog converter; and
   an RC circuit having a resistor and a capacitor, said reference voltage charging said capacitor by a predetermined time constant when said digital counting means begins counting down from said start value until said digital counting means reaches zero, whereby said RC circuit is charged to a voltage corresponding to a time period during which said digital counting means is counting down.

8. A digital-to-analog converter as defined in claim 7, further comprising switching means, responsive to said digital count signal output by said digital counter, for providing said reference voltage to said RC circuit when said digital counting means is counting down.

9. A digital-to-analog converter as defined in claim 8, wherein said switching means is a transistor, a base of said transistor receiving said digital count signal output by said digital counting means, wherein said digital count signal causes said transistor to turn on, thereby charging said capacitance, when said counting begins and also causes said transistor to turn off when said digital counting means reaches zero, thereby preventing further charging of said capacitance by said reference voltage.

10. A digital-to-analog converter as defined in claim 7, further comprising:
    a logic circuit receiving said digital count signal output by said digital counter; and
    switching means receiving an output of said logic circuit so as to enable said reference voltage to charge said RC circuit in response to said output of said logic circuit.

11. A digital-to-analog converter as defined in claim 10, wherein said logic circuit is an OR gate having input terminals connected to said plurality of lines from said digital counting means and said switching means is a transistor, wherein a base of said transistor is connected to an output of said OR gate.

12. A digital-to-analog converter as defined in claim 7, further comprising a switching means provided between said resistor and said capacitance such that said digital count signal on said plurality of lines causes said switching means to turn on, thereby charging said capacitance with by reference voltage, and turn off, thereby preventing further charging of said capacitance by said reference voltage.

* * * * *